United States Patent [19]

Kawamura et al.

[11] Patent Number: 5,582,952
[45] Date of Patent: Dec. 10, 1996

[54] PHOTOSENSITIVE LITHOGRAPHIC PRINTING PLATE CONTAINING A TWO-EQUIVALENT COUPLER RESIDUE-CONTAINING POLYMER

[75] Inventors: Koichi Kawamura; Keiji Akiyama; Toshifumi Inno; Katsuji Kitatani, all of Shizuoka, Japan

[73] Assignee: Fuji Photo Film Co., Ltd., Kanagawa, Japan

[21] Appl. No.: 399,585

[22] Filed: Mar. 7, 1995

[30] Foreign Application Priority Data

Mar. 8, 1994 [JP] Japan ................... 6-037206

[51] Int. Cl.$^6$ .................................. G03C 1/52
[52] U.S. Cl. ................. 430/166; 430/170; 430/180; 430/181; 430/182; 430/189; 430/275.1; 430/278.1; 430/300; 430/302; 430/145; 430/154
[58] Field of Search .................. 430/170, 180, 430/181, 182, 189, 275, 278, 300, 302, 145, 154, 166

[56] References Cited

U.S. PATENT DOCUMENTS 4,642,283  2/1987  Takahashi et al. .............. 430/180
5,225,309  7/1993  Suzuti et al. .................. 430/182

FOREIGN PATENT DOCUMENTS 60-192948  10/1985  Japan .
63-14140   1/1988   Japan .
63-127237  5/1988   Japan .
64-72152   3/1989   Japan .

*Primary Examiner*—Geraldine Letscher
*Attorney, Agent, or Firm*—Sughrue, Mion, Zinn, Macpeak & Seas

[57] ABSTRACT

A photosensitive lithographic printing plate which provides a wide range of proper conditions for development, high impression capacity, a flexible film sufficient in adhesion to a support and excellent processing suitability with a weakly alkaline developer (pH 12.5 or less) is disclosed. The photosensitive lithographic printing plate comprises a support and a photosensitive layer provided thereon, wherein the photosensitive layer is formed from a photosensitive composition containing at least a two-equivalent coupler residue-containing compound and a photosensitive compound or a photosensitive mixture acting as a positive type.

4 Claims, No Drawings

PHOTOSENSITIVE LITHOGRAPHIC PRINTING PLATE CONTAINING A TWO-EQUIVALENT COUPLER RESIDUE-CONTAINING POLYMER

FIELD OF THE INVENTION

The present invention relates to a positive photosensitive lithographic printing plate, and more particularly, to a photosensitive lithographic printing plate comprising an o-naphthoquinonediazide compound acting as a positive type and a particular compound soluble in an alkaline developer.

BACKGROUND OF THE INVENTION

Photosensitive compositions comprising o-naphthoquinone-diazide compounds and novolak phenol resins have been commercially used for manufacturing lithographic printing plates and as photoresists, as very excellent photosensitive compositions.

However, the novolak phenol resins used mainly as binders have drawbacks to be improved, such as poor contact with substrates, fragile films, inferior wear resistance, or insufficient impression capacity when used for lithographic printing plates, and therefore have a limitation on their application.

To solve such problems, various polymers have been examined as binders. For example, polyhydroxystyrenes or hydroxystyrene copolymers described in JP-B-52-41050 (the term "JP-B" as used herein means an "examined Japanese patent publication") are surely improved in film properties, but still have the disadvantage of inferior wear resistance.

Further, JP-A-51-34711 (the term "JP-A" as used herein means an "unexamined published Japanese patent application" proposes to use polymers containing structure units of acrylic acid derivatives in their molecular structure as binders. However, such polymers have a disadvantage in that a range of conditions for proper development is narrow.

JP-A-60-192948, JP-A-63-14140, JP-A-63-127237 and JP-A-64-72152 describe photosensitive lithographic printing plates acting as a positive type in which supports are provided with photosensitive layers comprising o-naphthoquinonediazide compounds and coupling components capable of undergoing diazo coupling reaction. However, such photosensitive layers have the disadvantage of being slow in development speed, when processed with weakly alkaline developers, particularly of pH 12.5 or less. According to the aforesaid patent specifications, particularly preferred examples of the coupler residues include naphthols, phloroglucines, pyrazolones, phthalimides, indoxyls, indazolones, acetamides, and β-ketoesters, and of these, pyrazolones are regarded as the most preferred coupler residues. In the aforesaid specifications, however, strongly alkaline developers are used, and processing suitability with weakly alkaline developers, particularly of pH 12.5 or less, is not described. It has been therefore difficult to deduce structures desirable for such weakly alkaline developers.

On the other hand, the prevention of environmental pollution recently requires simplified disposal of industrial waste. It is therefore strongly demanded to lower the pH of processing liquids for positive printing plates.

SUMMARY OF THE INVENTION

An object of the present invention is therefore to provide photosensitive lithographic printing plates which offer a wide range of proper conditions for development, high impression capacity and excellent processing suitability with weakly alkaline developers, particularly of pH 12.5 or less.

Another object of the present invention is to provide photosensitive lithographic printing plates formed of photosensitive compositions which offer good adhesion to substrates and produce flexible films.

The aforesaid problems have been solved by combining two-equivalent coupler residue-containing compounds, which are selected from a number of coupler residue-containing compounds, with photosensitive materials acting as a positive type.

That is, the present invention provides a photosensitive lithographic printing plate comprising a support and a photosensitive layer provided thereon, wherein said photosensitive layer is formed from a photosensitive composition containing at least a two-equivalent coupler residue-containing compound and a photosensitive compound or a photosensitive mixture acting as a positive type, thereby solving the aforesaid problem. The use of the two-equivalent coupler residue-containing compounds enables development at a lower pH and formation of durable images.

DETAILED DESCRIPTION OF THE INVENTION

In the present invention, when the two-equivalent coupler residue-containing compounds are polymers, the durability of images and processing suitability for development are further improved, and in addition, good adhesion to the substrates is obtained to form flexible films.

In the present invention, when the support is an aluminum plate, the photosensitive lithographic printing plate of the present invention is preferred for use as a presensitized plate.

In the present invention, further, when the support is an aluminum plate subjected to silicate treatment, processing with a non-silicate developer becomes preferably easy.

In the present invention, furthermore, when the photosensitive lithographic printing plates can be processed with weakly alkaline developers of pH 12.5 or less, waste liquors are also of pH 12.5 or less, which is preferred in terms of handling safety of the waste liquors. Even in treatment at such a lower pH, the use of the two-equivalent coupler residue-containing compounds enables formation of more durable images.

Although the two-equivalent coupler residue-containing compounds used in the present invention include all compounds each containing a two-equivalent coupler residue in its molecule, compounds are preferred which contain in molecular structure two-equivalent coupler residues each having a dissociation constant (pKa) of an active methine moiety ranging from 3 to 11, more preferably from 4 to 9, and particularly preferably from 4 to 7, and in addition, are insoluble in water and soluble in alkaline developers.

The compounds used in the present invention characteristically dissolve in alkaline developers owing to dissociation, and the aforesaid ranges of pKa give much better performance. A dissociation constant pKa of less than 3 results in inferior ink affinity of images obtained on printing, and a pKa exceeding 11 causes the development speed to reduce.

In the present invention, the compounds having the two-equivalent coupler residue at side chains may be either monomers or polymers. Particularly preferred compounds are polymers. The aforesaid monomers in the present invention are preferably compounds represented by the following general formula (I), and a group of the preferred polymers in the present invention includes polymers of the monomers represented by the following general formula (I):

wherein $R^1$ represents a hydrogen atom, an alkyl group having 1 to 4 carbon atoms or a chlorine atom; $L^1$ represents —CON($R^2$)— (wherein $R^2$ represents a hydrogen atom, an alkyl group having 1 to 4 carbon atoms or an substituted alkyl group having 1 to 6 carbon atoms), —COO—, —NHCO—, —OCO—,

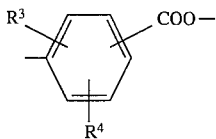

(wherein $R^3$ and $R^4$ each independently represents a hydrogen atom, a hydroxyl group, a halogen atom, or a substituted or unsubstituted alkyl, alkoxy, acyloxy or aryloxy group), and

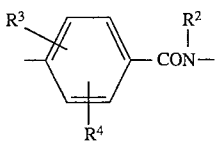

(wherein $R^2$, $R^3$ and $R^4$ have the same meanings as defined above); $L^2$ represents a group linking $L^1$ to Q; i represents 0 or 1; j represents 0 or 1; and Q represents a two-equivalent coupler residue.

Specifically, the linking group represented by $L^2$ is as follows;

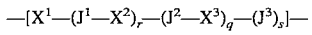

wherein $J^1$, $J^2$ and $J^3$ which may be the same or different, each represents —CO—, —SO$_2$, —CON($R^5$)— (wherein $R^5$ represents a hydrogen atom, an alkyl group having 1 to 6 carbon atoms, a substituted alkyl group having 1 to 6 carbon atoms), —SO$_2$N($R^5$)— (wherein $R^5$ has the same meaning as defined above), —N($R^5$)—$R^6$— (wherein $R^5$ has the same meanings as defined above, and $R^6$ represents an alkylene group having 1 to 4 carbon atoms), —N($R^5$)—$R^6$—N($R^7$)— (wherein $R^5$ and $R^6$ have the same meanings as defined above, and $R^7$ represents a hydrogen atom, an alkyl group having 1 to 6 carbon atoms or a substituted alkyl group having 1 to 6 carbon atoms), —O—, —S—, —N($R^5$)—CO—N($R^7$)— (wherein $R^5$ and $R^7$ have the same meanings as defined above), —N($R^5$)—SO$_2$—N($R^7$) (wherein $R^5$ and $R^7$ have the same meanings as defined above), —COO—, —OCO, —N($R^5$)CO$_2$— (wherein $R^5$ has the same meaning as defined above), or —N($R^5$)CO— (wherein $R^5$ has the same meaning as defined above); $X^1$, $X^2$ and $X^3$, which may be the same or different, each represents an alkylene group, a substituted alkylene group, an arylene group, a substituted arylene group, an aralkylene group or a substituted aralkylene group; and q, r and s each represents 0 or 1.

In the aforesaid general formula (I), $X^1$, $X^2$ and $X^3$, which may be the same or different from one another, each represents an unsubstituted or substituted alkylene, aralkylene or phenylene group having 1 to 10 carbon atoms, and the alkylene group may have a straight-chain or branched-chain structure. The alkylene groups includes, for example, methylene, methylmethylene, dimethylmethylene, dimethylene, trimethylene, tetramethylene, pentamethylene, hexamethylene and decylmethylene; the aralkylene groups includes, for example, benzylidene; and the substituted or unsubstituted phenylene groups includes, for example, p-phenylene, m-phenylene and methylphenylene.

Examples of substituent groups for the alkylene, aralkylene and phenylene groups represented by $X^1$, $X^2$ and $X^3$ include halogen atoms, a nitro group, a cyano group, alkyl groups, substituted alkyl groups, alkoxy groups, substituted alkoxy groups, groups represented by —NHCOR$^8$ (wherein $R^8$ represents alkyl, substituted alkyl, phenyl, substituted phenyl, aralkyl or substituted aralkyl), —NHSO$_2$R$^8$ (wherein $R^8$ has the same meaning as defined above), —SOR$^8$ ($R^8$ has the same meaning as defined above), —SO$_2$R$^8$ (wherein $R^8$ has the same meaning as defined above), —COR$^8$ (wherein $R^8$ has the same meaning as defined above), —CON($R^9$)($R^{10}$) (wherein $R^9$ and $R^{10}$, which may be the same or different from each other, each represents hydrogen, alkyl, substituted alkyl, phenyl, substituted phenyl, aralkyl or substituted aralkyl), —SO$_2$($R^9$)($R^{10}$) (wherein $R^9$ and $R^{10}$ have the same meanings as defined above), an amino group (which may be substituted with an alkyl group), a hydroxyl group, and groups forming hydroxyl groups by hydrolysis. When two or more groups of these substituent groups coexist, they may be the same or different from each other.

Examples of substituent groups for the aforesaid substituted alkyl groups, substituted alkoxy groups, substituted phenyl groups and substituted aralkyl groups include a hydroxyl group, a nitro group, alkoxyl groups having 1 to about 4 carbon atoms, groups represented by —NHSO$_2$R$^8$ (wherein $R^8$ has the same meaning as defined above) and —NHCOR$^8$ (wherein $R^8$ has the same meaning as defined above), groups represented by —SO$_2$($R^9$)($R^{10}$) (wherein $R^9$ and $R^{10}$ have the same meanings as defined above) and —CON($R^9$)($R^{10}$) (wherein $R^9$ and $R^{10}$ have the same meanings as defined above), —SO$_2$R$^8$ ($R^8$ has the same meanings as defined above), —COR$^8$ (wherein $R^8$ has the same meaning as defined above), halogen atoms, a cyano group, and an amino group (which may be substituted with an alkyl group).

Q, which represents a group linking to the monomer represented by general formula (I) at any moiety of $R_{51}$ to $R_{59}$, $Z_1$ to $Z_3$ and Y in the following general formulas (Cp-1) to (Cp-9), and in view of durability of images, it is preferred that it links thereto at the moieties of $R_{51}$ to $R_{59}$ General Formula (Cp-1)

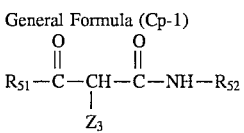

General Formula (Cp-2)

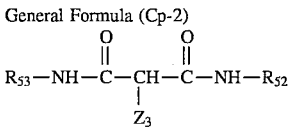

General Formula (Cp-3)

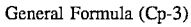

-continued

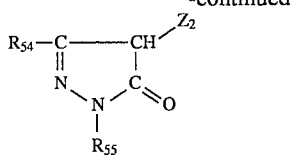

General Formula (Cp-4)

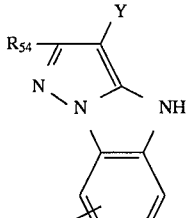

General Formula (Cp-5)

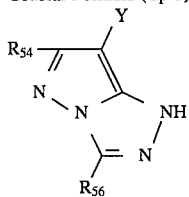

General Formula (Cp-6)

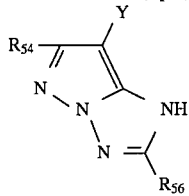

General Formula (Cp-7)

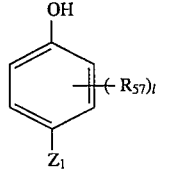

General Formula (Cp-8)

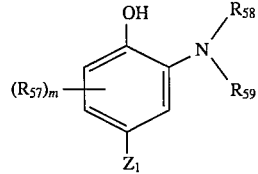

General Formula (Cp-9)

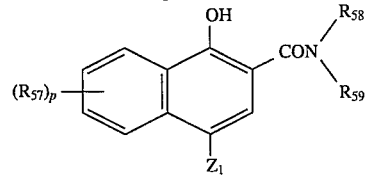

$R_{51}$ to $R_{59}$, l, m and p in the aforesaid general formulas (Cp-1) to (Cp-9) will be described below.

In the formulas, $R_{51}$ represents an aliphatic group, an aromatic group, an alkoxy group or a heterocyclic group, and $R_{52}$ and $R_{53}$ each represents an aromatic group or a heterocyclic group.

In the formulas, the aliphatic group represented by $R_{51}$ preferably have 1 to 22 carbon atoms, may be substituted or unsubstituted, and may have a chain or cyclic structure. Preferred substituent groups for the aliphatic group include alkoxy groups, aryloxy groups, an amino group, acylamino groups and halogen atoms, and the preferred substituent groups themselves may have further substituent groups. Examples of the aliphatic groups useful as $R_{51}$ are as follows: isopropyl, isobutyl, tert-butyl, isoamyl, tert-amyl, 1,1-dimethylbutyl, 1,1-dimethylhexyl, 1,1-diethylhexyl, dodecyl, hexadecyl, octadecyl, cyclohexyl, 2-methoxyisopropyl, 2-phenoxyisopropyl, 2-p-tert-butylphenoxyisopropyl, α-aminoisopropyl, α-(diethylamino)isopropyl, α-(succinimido)isopropyl, α-(phthalimido)isopropyl and α-(benzenesulfonamido)isopropyl groups.

When $R_{51}$, $R_{52}$ or $R_{53}$ represents an aromatic group (particularly, phenyl), the aromatic group may be substituted. The aromatic group such as phenyl may be substituted by an alkyl group, an alkenyl group, an alkoxy group, an alkoxycarbonyl group, an alkoxycarbonylamino group, an aliphatic amido group, an alkylsulfamoyl group, an alkylsulfonamido group, an alkylureido group or an alkyl-substituted succinimido group, each having 32 or less carbon atoms. The alkyl group may contain an aromatic group such as phenylene in the chain structure. The phenyl group may be further substituted with an aryloxy group, an aryloxycarbonyl group, an arylcarbamoyl group, an arylamido group, an arylsulfamoyl group, an arylsulfonamido group or an arylureido group, and aryl moieties of these substituent groups may be further substituted with one or more alkyl groups each having 1 to 22 carbon atoms.

The phenyl group represented by $R_{51}$, $R_{52}$ or $R_{53}$ may be further substituted with an amino group also including one substituted with a lower alkyl group containing 1 to 6 carbon atoms, a hydroxyl group, a carboxyl group, a sulfo group, a nitro group, a cyano group, a thiocyano group or a halogen atom.

Further, $R_{51}$, $R_{52}$ or $R_{53}$ may represent a substituent group formed by condensing a phenyl group with another ring, for example, a naphthyl group, a quinolyl group, an isoquinolyl group, a chromanyl group, a coumaranyl group, a tetrahydro-naphthyl group. These substituent groups themselves may have further substituent groups.

When $R_{51}$ represents an alkoxy group, the alkyl moiety may represent a straight-chain or branched-chain alkyl group containing 1 to 32, preferably 1 to 22 carbon atoms, an alkenyl group, a cyclic alkyl group, or a cyclic alkenyl group, and these groups may be substituted with halogen atoms, aryl groups, alkoxy groups, etc.

When $R_{51}$, $R_{52}$ or $R_{53}$ represents a heterocyclic group, the heterocyclic group links to the carbon atom of the carbonyl group or the nitrogen atom of the amido group in α-acylacetamide via one of carbon atoms forming the cycle. Examples of such heterocycles include thiophene, furan, pyran, pyrrole, pyrazole, pyridine, pyrazine, pyrimidine, pyridazine, indolizine, imidazole, thiazole, oxazole, triazine, thiadiazine and oxazine. These heterocycles may have further substituent groups at their rings.

In general formula (Cp-3), $R_{55}$ represents an straight-chain or branched-chain alkyl group having 1 to 32 carbon atoms, and preferably 1 to 22 carbon atoms (for example, methyl, isopropyl, tert-butyl, hexyl, and dodecyl), an alkenyl group (for example, allyl), a cyclic alkyl group (for example, cyclopentyl, cyclohexyl and norbornyl), an aralkyl group (for example, benzyl and β-phenylethyl) or a cyclic alkenyl group (for example, cyclopentenyl and cyclohexenyl). Each of these groups may be substituted with a halogen atom, a nitro group, a cyano group, an aryl group, an alkoxy group, an aryloxy group, a carboxyl group, an alkylthiocarbonyl group, an arylthiocarbonyl group, an alkoxycarbonyl group, an aryloxycarbonyl group, a sulfo group, a sulfamoyl group, a carbamoyl group, an acylamino group, a diacylamino group, an ureido group, an urethane group, a thiourethane group, a sulfonamido group, a heterocyclic group, an arylsulfonyl group, an alkylsulfonyl group, an arylthio group, an alkylthio group, an alkylamino group, a dialkylamino group, an anilino group, an N-arylanilino group, an N-alkylanilino group, an N-acylanilino group, a hydroxyl group, a mercapto group, etc.

$R_{55}$ may further represent an aryl group (for example, phenyl, $\alpha$-naphthyl and $\beta$-naphthyl). The aryl group may have one or more substituent groups, and examples of the substituent groups include alkyl groups, alkenyl groups, cyclic alkyl groups, aralkyl groups, cyclic alkenyl groups, halogen atoms, a nitro group, a cyano group, aryl groups, alkoxy groups, aryloxy groups, a carboxyl group, alkoxycarbonyl groups, aryloxycarbonyl groups, a sulfo group, a sulfamoyl group, a carbamoyl group, acylamino groups, diacylamino groups, an ureido group, an urethane group, a sulfonamido group, heterocyclic groups, arylsulfonyl groups, alkylsulfonyl groups, arylthio groups, alkylthio groups, alkylamino groups, dialkylamino groups, an anilino group, N-alkylanilino groups, N-arylanilino groups, N-acylanilino groups and a hydroxyl group.

$R_{55}$ may further represent a heterocyclic group (for example, a 5- or 6-membered heterocycle containing a nitrogen atom, an oxygen atom or a sulfur atom as a heteroatom, or a condensed heterocycle such as pyridyl, quinolyl, furyl, benzothiazolyl, oxazolyl, imidazolyl and naphthoxazolyl), or a heterocyclic group, an aliphatic or aromatic acyl group, an alkylsulfonyl group, an arylsulfonyl group, an alkylcarbamoyl group, an arylcarbamoyl group, an alkylthiocarbamoyl group or an arylthiocarbamoyl group, each of which is substituted with the substituent groups enumerated with regard to the aforesaid aryl groups.

In the above formulas, $R_{54}$ represents a hydrogen atom, a straight-chain or branched-chain alkyl, alkenyl, cyclic alkyl, aralkyl or cyclic alkenyl group having 1 to 32 carbon atoms, preferably 1 to 22 carbon atoms (these groups may contain the substituent groups enumerated with regard to the aforesaid $R_{55}$), an aryl or heterocyclic group (these groups may contain the substituent groups enumerated with regard to the aforesaid $R_{55}$), an alkoxycarbonyl group (for example, methoxycarbonyl, ethoxycarbonyl or stearyloxycarbonyl), an aryloxycarbonyl group (for example, phenoxycarbonyl or naphthoxycarbonyl), an aralkyloxycarbonyl group (for example, benzyloxycarbonyl), an alkoxy group (for example, methoxy, ethoxy or heptadecyloxy), an aryloxy group (for example, phenoxy or tolyloxy), an alkylthio group (for example, ethylthio or dodecylthio), an arylthio group (for example, phenylthio or $\alpha$-naphthylthio), a carboxyl group, an acylamino group {for example, acetylamino or 3-[(2,4-di-tert-amylphenoxy)acetamido]benzamido}, a diacylamino group, an N-alkyl-acylamino group (for example, N-methylpropionamido), an N-arylacylamino group (for example, N-phenylacetamido), an ureido group (for example, ureido, N-arylureido or N-alkylureido), an urethane group, a thiourethane group, an arylamino group (for example, phenylamino, N-methylanilino, diphenylamino, N-acetylanilino, and 2-chloro-5-tetradecaneamidoanilino), an alkylamino group (for example, n-butylamino, methylamino or cyclohexylamino), a cycloamino group (for example, piperidino or pyrrolidino), a heterocyclic amino group (for example, 4-pyridylamino or 2-benzoxazolylamino), an alkylcarbonyl group (for example, methylcarbonyl), an arylcarbonyl group (for example, phenylcarbonyl), a sulfonamido group (for example, alkylsulfonamido or arylsulfonamido), a carbamoyl group (for example, ethylcarbamoyl, dimethylcarbamoyl, N-methylphenylcarbamoyl, or N-phenylcarbamoyl), a sulfamoyl group (for example, N-alkylsulfamoyl, N,N-dialkylsulfamoyl, N-arylsulfamoyl, N-alkyl-N-arylsulfamoyl or N,N-diarylsulfamoyl), a cyano group a hydroxyl group or a sulfo group.

In the above formulas, $R_{56}$ represents a hydrogen atom or a straight-chain or branched-chain alkyl, alkenyl, cyclic alkyl, aralkyl or cyclic alkenyl group having 1 to 32 carbon atoms, preferably 1 to 22 carbon atoms, and these groups may contain the substituent groups enumerated with regard to the aforesaid $R_{55}$.

$R_{56}$ may further represent an aryl group or a heterocyclic group, and these groups may have the substituent groups enumerated with regard to the aforesaid $R_{55}$.

Furthermore, $R_{56}$ may represent a cyano group, an alkoxy group, an aryloxy group, a halogen atom, a carboxyl group, an alkoxycarbonyl group, an aryloxycarbonyl group, an acyloxy group, a sulfo group, a sulfamoyl group, a carbamoyl group, an acylamino group, a diacylamino group, an ureido group, an urethane group, a sulfonamido group, an arylsulfonyl group, an alkylsulfonyl group, an arylthio group, an alkylthio group, an alkylamino group, a dialkylamino group, an anilino group, an N-arylanilino group, an N-alkylanilino group, an N-acylanilino group or a hydroxyl group.

$R_{57}$, $R_{58}$ and $R_{59}$ each represents a group used for an ordinary four-equivalent phenol or $\alpha$-naphthol coupler. Examples of $R_{57}$ include a hydrogen atom, halogen atoms, alkoxycarbonylamino groups, aliphatic hydrocarbon residues, N-arylureido groups, acylamino groups, —O—$R_{62}$ and —S—$R_{62}$ (wherein $R_{62}$ represents an aliphatic hydrocarbon residue). When two or more $R_{57}$s coexist in the same molecule, they may be different from one another, and the aliphatic hydrocarbon residues include ones containing substituent groups. Further, two $R_{57}$s may form a nitrogen-containing heterocyclic nucleus by bonding to each other.

Further, when these substituent groups contain aryl groups, the aryl groups may contain the substituent groups enumerated with regard to the aforesaid $R_{55}$.

$R_{58}$ and $R_{59}$ include groups selected from aliphatic hydrocarbon residues, aryl groups and heterocyclic residues, and either of them may be hydrogen atoms. These groups include ones containing substituent groups. $R_{58}$ and $R_{59}$ may form a nitrogen-containing heterocyclic nucleus by bonding to each other.

The aliphatic hydrocarbon residues may be either saturated or unsaturated, and may have any of straight-chain, branched-chain and cyclic structures. Preferred examples of the aliphatic hydrocarbon residues include alkyl groups (for example, methyl, ethyl, propyl, isopropyl, butyl, t-butyl, isobutyl, dodecyl, octadecyl, cyclobutyl and cyclohexyl) and alkenyl groups (for example, allyl and octenyl). Examples of the aryl groups include a phenyl group and a naphthyl group, and typical examples of the heterocyclic residues include groups such as pyridinyl, quinolyl, thienyl, piperidyl and imidazolyl. Examples of the substituent groups introduced into these aliphatic hydrocarbon residues, aryl groups and heterocyclic residues include halogen atoms and groups such as nitro, hydroxyl, carboxyl, amino, substituted amino, sulfo, alkyl, alkenyl, aryl, heterocyclic, alkoxy, aryloxy, arylthio, arylazo, acylamino, carbamoyl, ester, acyl, acyloxy, sulfonamido, sulfamoyl, sulfonyl and morpholino.

l represents an integer of 1 to 4; m represents an integer of 1 to 3; and p represents an integer of 1 to 5.

Of the aforesaid two-equivalent coupler residues, it is preferred that in general formula (Cp-1), $R_{51}$ is a t-butyl group, or a substituted or unsubstituted aryl group, and $R_{52}$ is a substituted or unsubstituted aryl group, and that in general formula (Cp-2), $R_{52}$ and $R_{53}$ are substituted or unsubstituted aryl groups.

It is further preferred that in general formula (Cp-3), $R_{54}$ is an acylamino group, an ureido group or an arylamino group and $R_{55}$ is a substituted aryl group, that in general formula (Cp-4), $R_{54}$ is an acylamino group, an ureido group or an arylamino group and $R_{56}$ is a hydrogen atom, and that in both general formulas (Cp-5) and (Cp-6), $R_{54}$ and $R_{56}$ are straight-chain or branched-chain alkyl groups, alkenyl groups, cyclic alkyl groups, aralkyl groups or cyclic alkenyl groups.

It is preferred that in general formula (Cp-7), $R_{57}$ represents 2-acylamino or 2-ureido, 5-acylamino or 5-alkyl, and 6-hydrogen or 6-chlorine, and that in general formula (Cp-9), $R_{57}$ represents 5-hydrogen, 5-acylamino, 5-sulfonamido or 5-alkoxycarbonyl, $R_{58}$ represents a hydrogen atom, and $R_{59}$ represents a phenyl group, an alkyl group, an alkenyl group, a cyclic alkyl group, an aralkyl group or a cyclic alkenyl group.

$Z_1$ to $Z_3$ and Y in general formulas (Cp-1) to (Cp-9) will be described in more detail below.

$Z_1$ represents a halogen atom, a sulfo group, an acyloxy group, an alkoxy group, an aryloxy group, a heterocyclic oxy group, an alkylthio group, an arylthio group or a heterocyclic thio group, and these groups may be further substituted with aryl groups (for example, phenyl), a nitro group, a hydroxyl group, a cyano group, a sulfo group, alkoxy groups (for example, methoxy), aryloxy groups (for example, phenoxy), acyloxy groups (for example, acetoxy), acylamino groups (for example, acetylamino), sulfonamido groups (for example, methanesulfonamido), sulfamoyl groups (for example, methylsulfamoyl), halogen atoms (for example, fluorine, chlorine and bromine), a carboxyl group, carbamoyl groups (for example, methylcarbamoyl), alkoxycarbonyl groups (for example, methoxycarbonyl), sulfonyl groups (for example, methylsulfonyl), etc.

$Z_2$ and Y each represents a releasing group which is bonded to a coupling position via an oxygen atom, a nitrogen atom or a sulfur atom. When each of $Z_2$ and Y links to the coupling position through an oxygen atom, a nitrogen atom or a sulfur atom, each of these atoms is bonded to an alkyl group, an aryl group, an alkylsulfonyl group, an arylsulfonyl group, an alkylcarbonyl group, an arylcarbonyl group or a heterocyclic group. Further, in the case of the nitrogen atom, they also mean groups which can form 5- or 6-membered rings containing the nitrogen atoms to give releasing groups (for example, imidazolyl, pyrazolyl, triazolyl and tetrazolyl).

The aforesaid alkyl, aryl and heterocyclic groups may contain substituent groups, and examples of the substituent groups include alkyl groups (for example, methyl and ethyl), alkoxy groups (for example, methoxy and ethoxy), aryloxy groups (for example, phenoxy), alkoxycarbonyl groups (for example, methoxycarbonyl), acylamino groups (for example, acetylamino), a carbamoyl group, alkylcarbamoyl groups (for example, methylcarbamoyl and ethylcarbamoyl), dialkylcarbamoyl groups (for example, dimethylcarbamoyl), arylcarbamoyl groups (for example, phenylcarbamoyl), alkylsulfonyl groups (for example, methylsulfonyl), arylsulfonyl groups (for example, phenylsulfonyl), alkylsulfonamido groups (for example, methanesulfonamido), arylsulfonamido groups (for example, phenylsulfonamido), a sulfamoyl group, alkylsulfamoyl groups (for example, ethylsulfamoyl), dialkylsulfamoyl groups (for example, dimethylsulfamoyl), alkylthio groups (for example, methylthio), arylthio groups (for example, phenylthio), a cyano group, a nitro group and halogen atoms (for example, fluorine, chlorine and bromine). When two or more substituent groups coexist in molecule, they may be different from each other.

Particularly preferred examples of the substituent groups include halogen atoms, alkyl groups, alkoxy groups, alkoxycarbonyl groups and a cyano group.

Preferred groups of $Z_2$ include groups linked to the coupling positions through nitrogen atoms or sulfur atoms, and preferred groups of Y include a chlorine atom and groups linked to the coupling positions through oxygen atoms, nitrogen atoms or sulfur atoms.

$Z_3$ is represented by the following general formula (R-1), (R-2). (R-3) or (R-4).

$$—OR_{63} \quad (R\text{-}1)$$

wherein $R_{63}$ represents an aryl group or a heterocyclic group which may be substituted.

(R-2)

(R-3)

wherein $R_{64}$ and $R_{65}$, which may be the same or different, each represents a hydrogen atom, a halogen atom, a carboxylic acid ester group, an amino group, an alkyl group, an alkylthio group, an alkoxy group, an alkylsulfonyl group, an alkylsulfinyl group, a carboxyl group, a sulfonic acid group, or an unsubstituted or substituted phenyl or heterocyclic group.

(R-4)

wherein $W_1$ represents a nonmetallic atom required to form a 4-, 5- or 6-membered ring together with the component of the following formula:

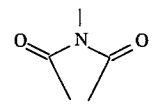

Preferred groups represented by general formula (R-4) include those represented by general formulas (R-5) to (R-7).

(R-5)

-continued

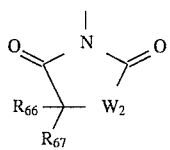
(R-6)

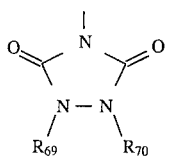
(R-7)

wherein $R_{66}$ and $R_{67}$ each represents a hydrogen atom, an alkyl group, an aryl group, an alkoxy group, an aryloxy group, or a hydroxyl group; $R_{68}$, $R_{69}$ and $R_{70}$ each represents a hydrogen atom, an alkyl group, an aryl group, an aralkyl group or an acyl group; and $W_2$ represents an oxygen atom or a sulfur atom.

The aforesaid monomers can be selected from those described in JP-A-2-44345.

Typical coupler monomers are exemplified below, but are not to be construed as being limited to these examples.

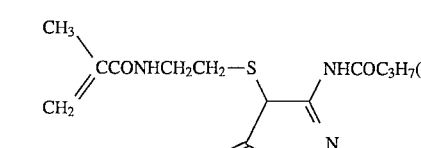
(1)

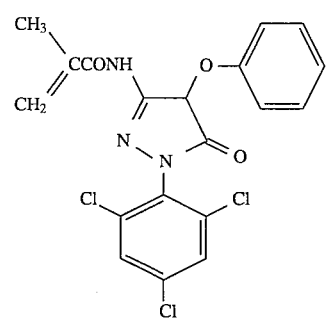
(2)

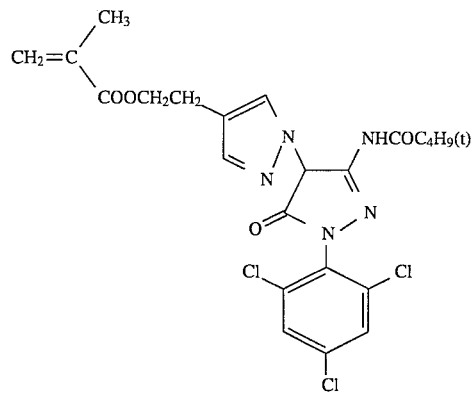
(3)

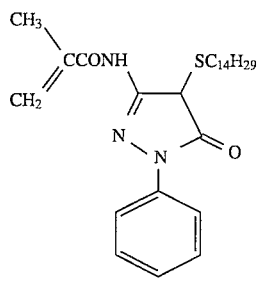
(4)

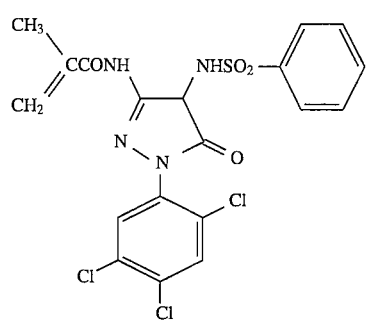
(5)

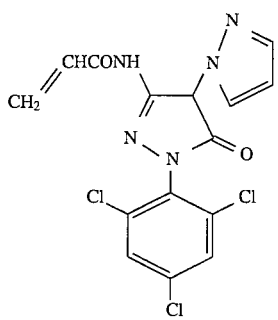
(6)

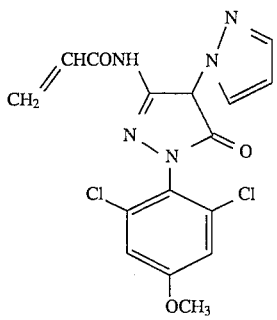
(7)

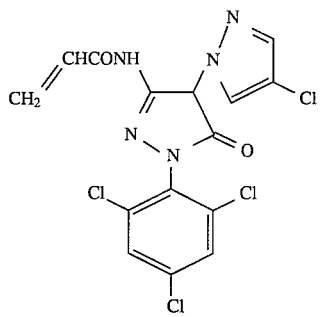
(8)

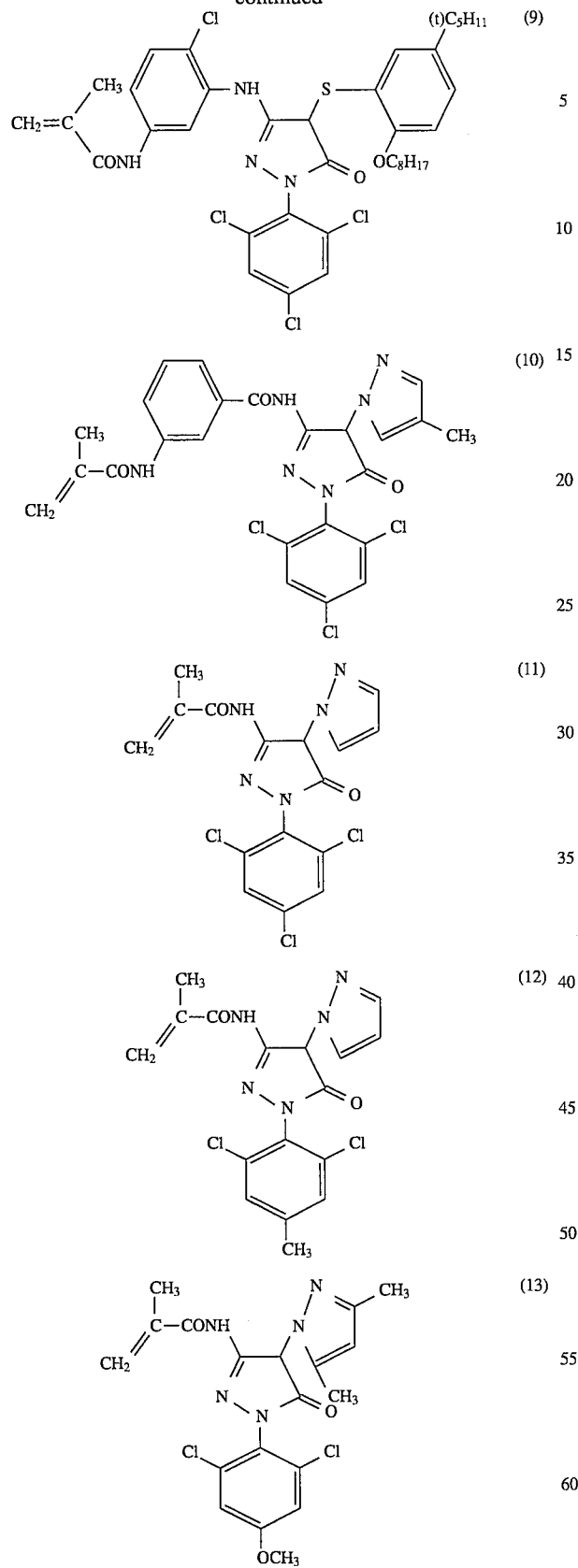
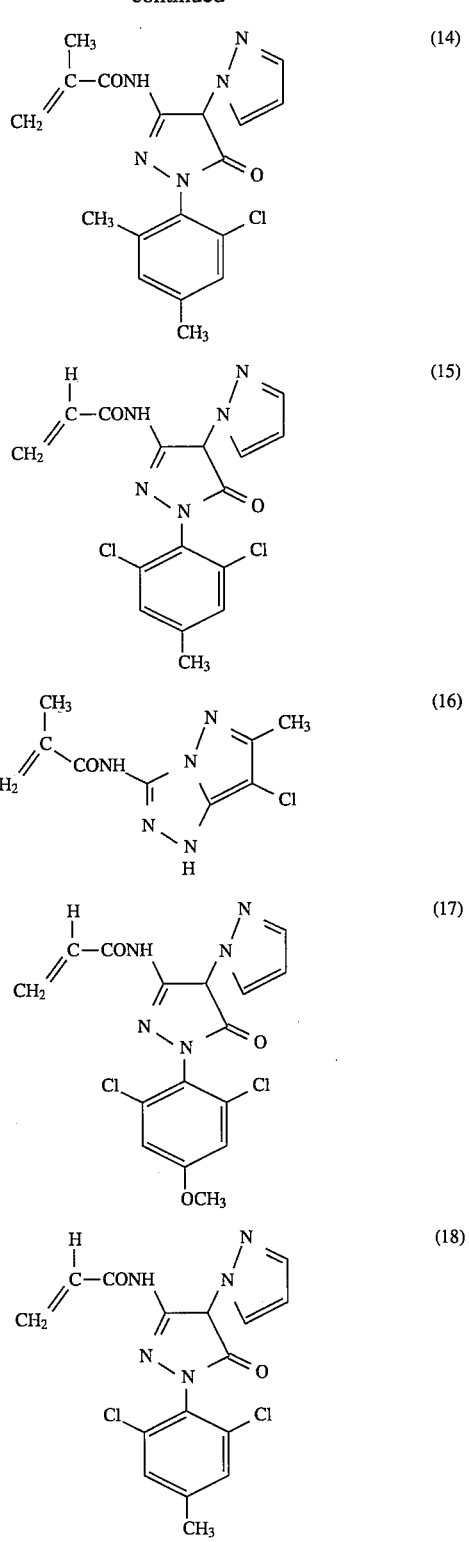

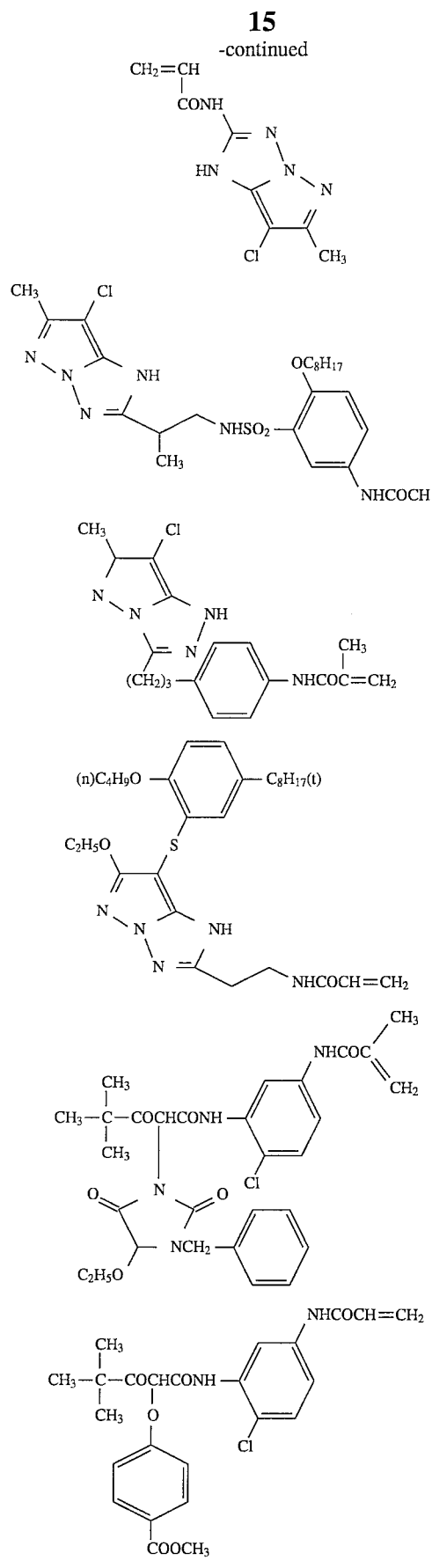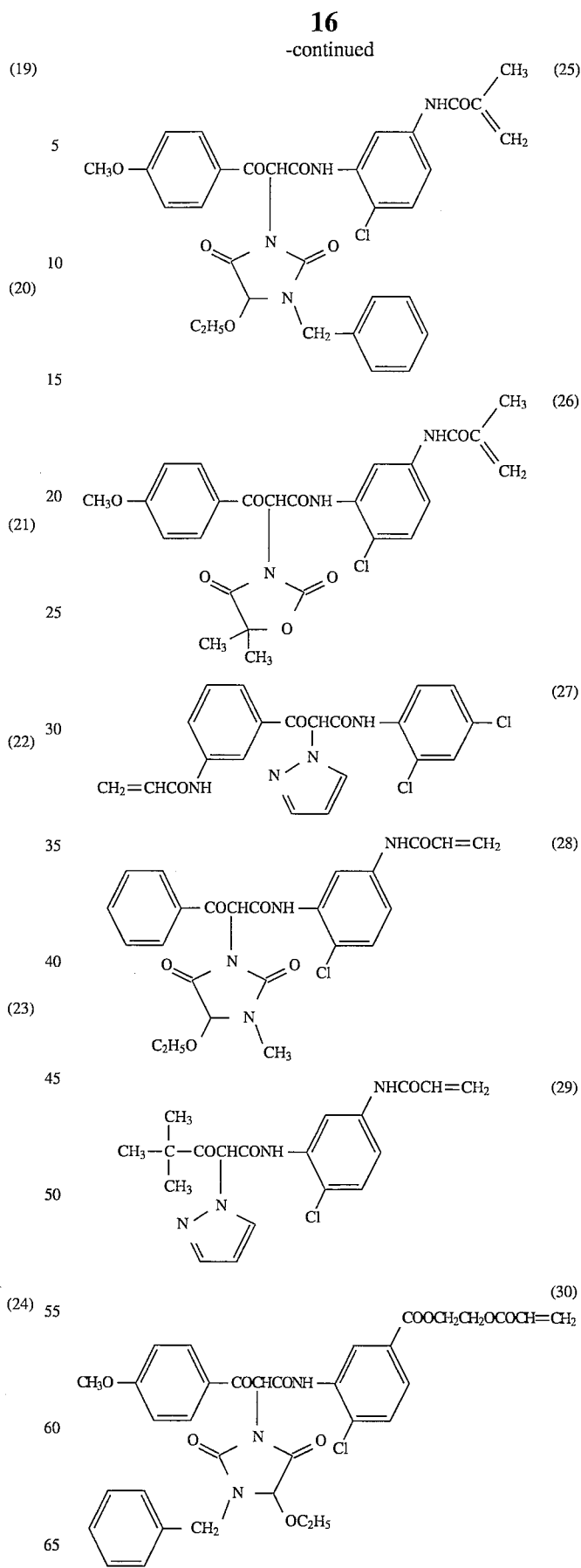

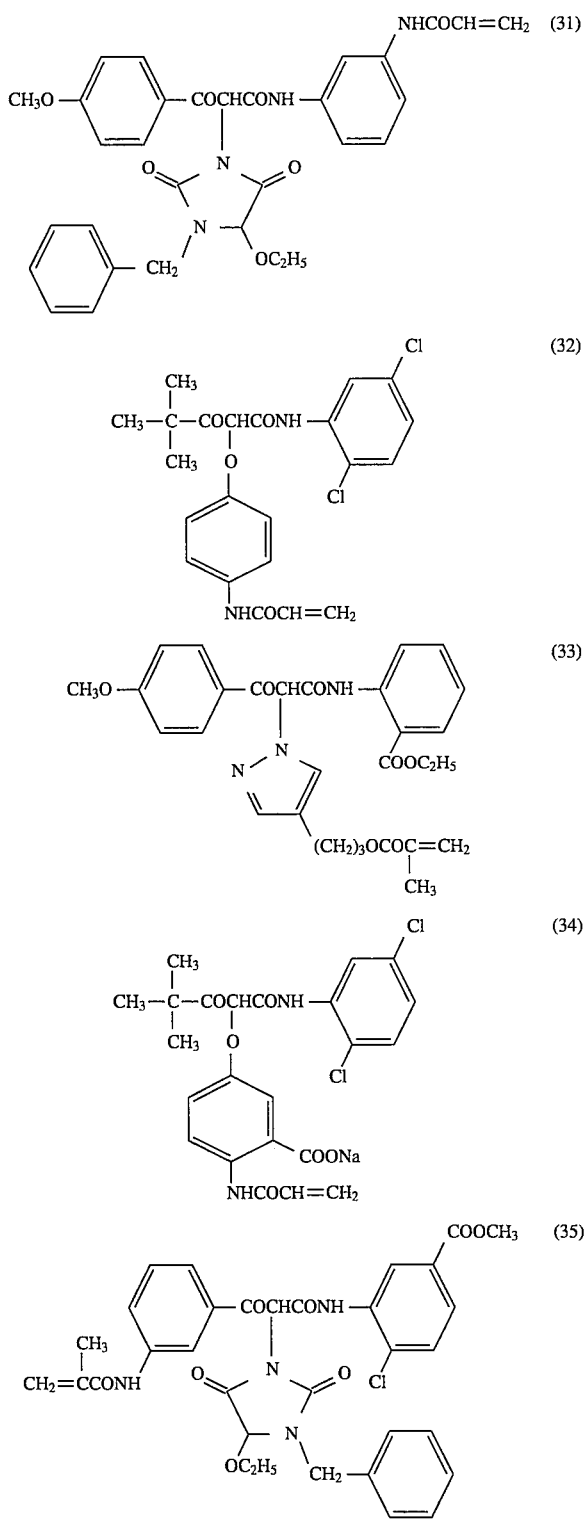

Although the polymers used in the present invention which contain two-equivalent coupler residues at the side chains may be exclusively formed of monomers represented by general formula (I), they may be multi-component copolymers having recurring structures which are formed by combining one or more common vinyl-based monomers as described in JP-A-63-1279237, with the aforesaid monomers. Such multi-component copolymers contain structural units represented by general formula (I) preferably in an amount of 10 mole % or more, more preferably in an amount of 20 mole % or more, and particularly preferably in an amount of 30 mole % or more.

Polymerization of the monomers of the present invention which contain two-equivalent coupler residues at the side chains is described in JP-A-2-44345, U.S. Pat. No. 4,080, 211, JP-A-58-42044, U.S. Pat. No. 3,451,820, JP-A-62-276548 and JP-A-60-218646.

When the two-equivalent coupler residue-containing compounds of the present invention are polymers, the weight-average molecular weight (Mw) of the polymers ranges from $1.0 \times 10^3$ to $5.0 \times 10^5$ preferably from $5.0 \times 10^3$ to $1.0 \times 10^5$, and more preferably from $1.0 \times 10^4$ to $5.0 \times 10^4$.

The positive photosensitive compounds and photosensitive mixtures will be described below, which are used in combination with the two-equivalent coupler residue-containing compounds of the present invention. As the positive photosensitive compounds or photosensitive mixtures, photosensitive compositions containing previously known o-quinonediazide compounds can be used.

Preferred positive photosensitive compounds in the present invention are o-quinonediazide compounds, and preferred positive photosensitive mixtures are ones comprising various o-quinonediazide compounds, or ones comprising o-quinonediazide compounds, other photosensitive compounds and additives.

The o-quinonediazide compounds used in the present invention are compounds each containing at least one o-quinonediazide group and increasing alkali-solubility by active ray irradiation, and compounds of various structures can be used for them. For example, usable compounds are those described in J. Kosar, *Light-Sensitive Systems,* John Wiley & Sons, Inc., pp. 339–352, and particularly preferred compounds are sulfonates or sulfonamides of o-quinonediazides obtained by reacting with various aromatic polyhydroxy compounds or aromatic amino compounds. Further, preferably used compounds are esters of benzoquinone-(1, 2)-diazidesulfonyl chloride or naphthoquinone-(1,2)-diazide-5-sulfonyl chloride with pyrogallol-acetone resins as described in JP-B-43-28403, esters of benzoquinone-(1,2)-diazidesulfonyl chloride or naphthoquinone-(1,2)-diazide-5-sulfonyl chloride with phenol-formaldehyde resins as described in U.S. Pat. Nos. 3,046,120 and 3,188,210, and cresol-formaldehyde resins.

Similarly, esters of naphthoquinone-(1,2)-diazide-4-sulfonyl chloride with phenol-formaldehyde resins or cresol-formaldehyde resins, or esters of naphthoquinone-(1,2)-diazide-4-sulfonyl chloride with pyrogallol-acetone resins are also preferably used. A number of patent specifications have reported other useful o-quinonediazide compounds. For example, the compounds are described in JP-A-47-5303, JP-A- 48-63802, JP-A-48-63803, JP-A-48-96575, JP-A-49-38701, JP-A-48-13354, JP-B-41-11222, JP-B-45-9610, JP-B-49-17481, U.S. Pat. Nos. 2,797,213, 3,454,400, 3,544, 323, 3,573,917, 3,674,495, and 3,785,825, British Patents 1,227,602, 1,251,345, 1,267,005, 1,329,888, and 1,330,932, German Patent 854,890, etc.

o-Quinonediazide compounds preferably used in the present invention are sulfonates or sulfonamides formed by reacting naphthoquinone-(1,2)-diazide-5-sulfonyl chloride or naphthoquinone-(1,2)-diazide-4-sulfonyl chloride with various aromatic polyhydroxy compounds or aromatic amino compounds. More preferred ones are esters of these sulfonyl chlorides with pyrogallol-acetone resins, phenol-formaldehyde resins, cresol-formaldehyde resins or polyhydroxybenzophenone, and particularly preferred ones are esters of these sulfonyl chlorides with pyrogallol-acetone resins.

The amount of o-quinonediazide compounds used in the present invention ranges from 1 to 50% by weight, preferably from 5 to 30% by weight, and more preferably from 10 to 30% by weight, based on the whole solid components of photosensitive compositions. These compounds can be used singly, or may be used as a mixture of their several compounds.

The photosensitive lithographic printing plates of the present invention can each contain a water-insoluble and aqueous alkali-soluble resin. When the two-equivalent coupler residue-containing compounds of the present invention are polymers, these compounds act as binders, whereas when the compounds are low in molecular weight, the water-insoluble and aqueous alkali-soluble resins usable together therewith act as binders. Although the water-insoluble and aqueous alkali-soluble resins usable together therewith in the present invention include various resins, preferred ones are the following novolak resins.

Examples thereof include phenol-formaldehyde resins and cresol-formaldehyde resins such as m-cresol-formaldehyde resins, p-cresol-formaldehyde resins, o-cresol-formaldehyde resins, m-/p-cresol mixture-formaldehyde resins, phenol/cresol (any of m-, p-, and o-cresols, and m-/p-, m-/o-, and o-/p-cresol mixtures) mixture-formaldehyde resins.

Besides, resol-type phenol resins are also preferably used, and preferred ones are phenol/cresol (any of m-, p-, and o-cresols, and m-/p-, m-/o-, and o-/p-cresol mixtures) mixture-formaldehyde resins, and particularly, phenol resins described in JP-A-61-217034.

It is also possible to use various alkali-soluble polymers, such as phenol-modified xylene resins, polyhydroxystyrenes, halogenated polyhydroxystyrenes, phenolic hydroxy group-containing acrylic resins as disclosed in JP-A-51-34711, sulfonamido group-containing acrylic resins described in JP-A-2-866, and urethane resins. The weight-average molecular weight of these alkali-soluble polymers is preferably from 500 to 200,000 and the number-average molecular weight thereof is preferably from 200 to 60,000.

Such alkali-soluble polymers may be used singly or as a combination of two or more kinds thereof, and the amount thereof to be added is preferably 70% by weight or less, based on the whole solid components of the photosensitive compositions.

Various additives can be further added, as needed, to the positive photosensitive compositions of the present invention.

For example, condensation products of phenols substituted with alkyl groups each having 3 to 8 carbon atoms with formaldehyde, such as octylphenol-formaldehyde resins, are added thereto to improve ink-receptivity of images.

In order to further improve sensitivity, cyclic acid anhydrides, phenols and organic acids can also be used in combination. Usable cyclic acid anhydrides include phthalic anhydride, tetrahydrophthalic anhydride, hexahydrophthalic anhydride, 3,6-endooxy-$\Delta^4$-tetrahydrophthalic anhydride, tetrachlorophthalic anhydride, maleic anhydride, chloromaleic anhydride, α-phenylmaleic anhydride, succinic anhydride and pyromellitic anhydride. Examples of the phenols include bisphenol A, p-nitrophenol, p-ethoxyphenol, 2,4,4'-trihydroxybenzophenone, 2,3,4-trihydroxybenzophenone, 4-hydroxybenzophenone, 4,4',4''-trihydroxytriphenyl-methane and 4,4',3'',4''-tetrahydroxy-3,5,3',5'-tetramethyltriphenyl-methane. Further, the organic acids include sulfonic acids, sulfinic acids, alkyl sulfates, phosphonic acids, phosphates and carboxylic acids as described in JP-A-60-88942, JP-A-2-96755, etc. Examples thereof include p-toluenesulfonic acid, dodecylbenzenesulfonic acid, p-toluenesulfinic acid, ethyl sulfate, phenylphosphonic acid, phenylphosphinic acid, phenyl phosphate, diphenyl phosphate, benzoic acid, isophthalic acid, adipic acid, p-toluic acid, 3,4-dimethoxybenzoic acid, phthalic acid, terephthalic acid, 4-cyclohexene-1,2-dicarboxylic acid, erucic acid, lauric acid, n-undecanoic acid, and ascorbic acid.

The content of the aforesaid cyclic acid anhydrides, phenols and organic acids in the photosensitive compositions are preferably from 0.05 to 20% by weight, more preferably from 0.5 to 15% by weight, and particularly preferably from 0.1 to 10% by weight.

In order to increase processing stability to development conditions, nonionic surface active agents as described in JP-A-62-251740 and JP-A-3-208514 or amphoteric surface active agents as described in JP-A-59-121044 and JP-A-4-13149 can be added to the photosensitive compositions of the present invention.

Examples of the nonionic surface active agents include sorbitan tristearate, sorbitan monopalmitate, sorbitan trioleate, stearic monoglyceride, and polyoxyethylene nonylphenyl ether.

Examples of the amphoteric surface active agents include alkyldi(aminoethyl)glycines, alkylpolyaminoethylglycine hydrochlorides, 2-alkyl-N-carboxyethyl-N-hydroxyethylimidazolium betaines, and N-tetradecyl-N,N-betaine type compounds [for example, Amogen K (trade name) manufactured by Dai-ichi Kogyo Seiyaku Co., Ltd.].

The content of nonionic surface active agents and amphoteric surface active agents in the photosensitive compositions is preferably from 0.05 to 15% by weight, more preferably from 0.1 to 5% by weight, and particularly preferably from 0.1 to 3% by weight.

Print-out agents to obtain visible images immediately after exposure and dyes or pigments as image-coloring agents can be added to the photosensitive compositions of the present invention.

Typical examples of the print-out agents include combinations of compounds releasing acids by light exposure (photo acid generators) and organic dyes capable of forming salts therewith. Examples thereof include combinations of o-naphthoquinonediazide-4-sulfonic halogenide and salt-formable organic dyes described in JP-A-50-36209 and JP-A-53-8128, and combinations of trihalomethyl compounds and salt-formable organic dyes described in JP-A-53-36223, JP-A-54-74728, JP-A-60-3626, JP-A-61-143748, JP-A-61-151644 and JP-A-63-58440. Such trihalomethyl compounds include oxazole compounds and triazine compounds, either of which are excellent in aging stability and give clear print-out images. The amount thereof to be added is preferably from 0.1 to 10% by weight, more preferably from 0.1 to 5% by weight, and particularly preferably from 0.3 to 3% by weight.

Besides the aforesaid salt-formable organic dyes, other dyes can be used as the image-coloring agents. Preferred dyes are oil-soluble dyes and basic dyes, in addition to salt-formable organic dyes. Examples thereof include Oil Yellow #101, Oil Yellow #103, Oil Pink #312, Oil Green BG, Oil Blue BOS, Oil Blue #603, Oil Black BY, Oil Black BS, Oil Black T-505 (the above dyes are manufactured by Orient Kagaku Kogyo Co., Ltd.), Victoria Pure Blue, Crystal Violet (CI42555), Methyl Violet (CI42535), Ethyl Violet, Rhodamine B (CI145170B), Malachite Green (CI42000), and Methylene Blue (CI52015). Further, dyes described in JP-A-62-293247 are particularly preferred. The content of these dyes added to the photosensitive compositions is from 0.01 to 10% by weight, preferably from 0.1 to 3% by weight, and particularly preferably from 0.5 to 2% by weight, based on the whole solid components of the photosensitive compositions.

To impart flexibility to coated films, plasticizers are further added, as needed, to the photosensitive compositions of the present invention. For example, there are used butyl phthalyl, polyethylene glycol, tributyl citrate, diethyl phthalate, dibutyl phthalate, dihexyl phthalate, dioctyl phthalate, tricresyl phosphate, tributyl phosphate, trioctyl phosphate, tetrahydrofurfuryl oleate, and oligomers and polymers of acrylic acid or methacrylic acid.

The positive photosensitive lithographic printing plates of the present invention can be usually prepared by dissolving the aforesaid components in solvents, and then applying the solutions to suitable supports. Examples of the solvents used in the present invention include ethylene dichloride, cyclohexanone, methyl ethyl ketone, methanol, ethanol, propanol, ethylene glycol monomethyl ether, 1-methoxy-2-propanol, 2-methoxyethyl acetate, 1-methoxy-2-propyl acetate, dimethoxy-ethane, methyl lactate, ethyl lactate, N,N-dimethylacetamide, N,N-dimethylformamide, tetramethylurea, N-methylpyrrolidone, dimethyl sulfoxide, sulfolane, γ-butyrolactone and toluene. However, the present invention is not limited to these solvents.

These solvents are used singly or as a mixture. The content of all solid components in the solvent is preferably from 1 to 50% by weight, more preferably from 5 to 30% by weight, and particularly preferably from 7 to 20% by weight. The coated amount (solid content) on a support after coating and drying varies depending upon use. For the photosensitive printing plates, the amount is generally from 0.3 to 5.0 g/m$^2$, more preferably from 0.5 to 3.0 g/m$^2$, and particularly preferably from 0.7 to 3.0 g/m$^2$.

Various techniques can be used for coating. Examples of the techniques include bar coater coating, whirl coating, spray coating, curtain coating, dip coating, air knife coating, blade coating and roll coating. Less coated amounts increase apparent sensitivity, but result in lowering film properties of the photosensitive films.

Surfactants to give better coating properties, for example fluorine-based surfactants as described in JP-A-62-170950, can be added to the photosensitive layers of the present invention. The amount thereof to be added is preferably from 0.01 to 2.0% by weight, more preferably from 0.03 to 1.0% by weight, and particularly preferably from 0.05 to 0.5% by weight, based on the whole photosensitive compositions.

Supports used in the present invention are dimensionally stable plate-like materials, and examples thereof include paper, paper laminated with plastics (for example, polyethylene, polypropylene and polystyrene), metallic plates (for example, aluminum, zinc and copper), plastic films (for example, cellulose diacetate, cellulose triacetate, cellulose propionate, cellulose butyrate, cellulose acetate butyrate, cellulose nitrate, polyethylene terephthalate, polyethylene, polystyrene, polypropylene, polycarbonate and polyvinyl acetal), and paper and plastic films laminated or deposited with the aforesaid metals.

Among these supports, dimensionally stable and comparatively inexpensive aluminum plates are particularly preferred. Preferred examples of the aluminum plates are pure aluminum plates and aluminum alloy plates containing traces of different elements, and further, plastic films laminated or deposited with aluminum also are preferred. The different elements contained in the aluminum alloys include silicon, iron, manganese, copper, magnesium, chromium, zinc, bismuth, nickel and titanium. The content of the different elements in alloy is 10% by weight or less at highest. In the present invention, although pure aluminum is preferred particularly, aluminum containing traces of different elements can also be used, because of difficulty in preparing completely pure aluminum in the refining technology. Thus, the aluminum plates applied to the present invention have no specified composition, and aluminum plates which are hitherto known materials can be used suitably. The thickness of the aluminum plates used in the present invention is from about 0.1 to about 0.6 mm, preferably from 0.15 to 0.4 mm, and more preferably from 0.2 to 0.3 mm.

Prior to the surface-roughening of the aluminum plate, degreasing treatment is carried out, for example, with a surfactant, an organic solvent or an aqueous alkaline solution to remove roller oil on the surface, if necessary.

Various methods can be applied to roughening treatment of the surface of the aluminum plate, and examples thereof include a mechanical surface-roughening method, an electro-chemical surface-roughening method due to dissolving the surface, and a chemical method due to selectively dissolving the surface. As the mechanical methods, there can be used known methods such as a ball abrading, brush abrading, blast abrading, and buff abrading methods. The electrochemical surface-roughening methods include a method of carrying out the surface-roughening in a hydrochloric acid or nitric acid electrolyte through alternating current or direct current. A combined method of both as disclosed in JP-A-54-63902 can also be used.

In order to increase water retention characteristics and resistance to wear of the surface, such a surface-roughened aluminum plate is subjected to an anodizing treatment, after alkali-etched and neutralized as needed. As electrolytes used in the anodizing treatment of the aluminum plate, there can be used various electrolytes capable of forming porous oxide layers, and ones generally used are sulfuric acid, phosphoric acid, oxalic acid, chromic acid or mixed acids thereof. The concentration of these electrolytes is suitably determined according to the kind thereof.

Treatment conditions of anodizing widely vary with electrolytes used and it is therefore difficult to generally specify the conditions. However, on the whole, the concentration of the electrolytes in solution suitably ranges from 1 to 80% by weight, the temperature of the solution from 5° to 70° C., the current density from 5 to 60 A/dm$^2$, the voltage from 1 to 100 V, and the time required for electrolysis from 10 seconds to 5 minutes.

Too small amount of the anodized film causes insufficient press life and often develops scratches at non-image portions of the lithographic printing plate, resulting in developing so-called "scratching" that ink adheres to the scratched portions during printing. Too much amount of the anodized film often generates residual film on development and is also unfavorable in view of cost. The amount of the anodized film is preferably from 0.2 to 5.0 g/m$^2$, more preferably from 0.5 to 4.0 g/m$^2$, and particularly preferably from 1.0 to 4.0 g/m$^2$.

After anodized, the aluminum plate surface is subjected to hydrophilizing treatment, as needed. The hydrophilizing treatment used in the present invention include the methods of treating with alkali metal silicates (for example, an aqueous solution of sodium silicate) as disclosed in U.S. Pat. Nos. 2,714,066, 3,181,461, 3,280,734 and 3,902,734. In these methods, the supports are subjected to dip treatment or electrolysis treatment in aqueous solutions of sodium silicate. Additional examples thereof include the method of treating with potassium fluorozirconate as disclosed in JP-B-36-22063 and the methods of treating with polyvinyl phosphonic acid as disclosed in U.S. Pat. Nos. 3,276,868, 4,153, 461 and 4,689,272. An aluminum plate treated with silicates is particularly preferred as a support, because it is unnecessary to hydrophilize the aluminum plate with silicates after development.

In the positive photosensitive lithographic printing plates of the present invention, in which the supports are provided with positive photosensitive composition layers, undercoat layers can be formed therebetween, or mat layers can be formed on the photosensitive composition layers, as needed.

Various organic compounds are used as components for the undercoat layers. Examples thereof include carboxymethyl cellulose, dextrin, gum arabic, amino-group containing phosphonic acids such as 2-aminoethylphosphonic acid, organic phosphonic acids such as phenylphosphonic acids which may be substituted, naphthylphosphonic acid, alkylphosphonic acids, glycerophosphonic acid, methylenediphosphonic acid, or ethylenediphosphonic acid, organic phosphoric acids such as phenylphosphoric acid which may be substituted, naphthylphosphoric acid, alkylphosphoric acids, or glycerophosphoric acid, organic phosphinic acids such as phenylphosphinic acids which may be substituted, naphthylphosphinic acid, alkylphosphinic acids, or glycerophosphinic acid, amino acids such as glycine or β-alanine, hydrochlorides of hydroxy group-containing amines such as triethanolamine hydrochloride, and they can be used as a mixture of two or more kinds thereof.

This organic undercoat layer can be provided according to the following methods. That is, one method is that the aforesaid organic compound is dissolved in water or an organic solvent such as methanol, ethanol or methyl ethyl ketone or a mixed solvent thereof, and the resulting solution is applied to an aluminum plate and dried; and another method is that the aforesaid organic compound is dissolved in water, an organic solvent such as methanol, ethanol or methyl ethyl ketone or a mixed solvent thereof, and an aluminum plate is dipped in the resulting solution to allow the aforesaid compound to be adsorbed, then washed with water, etc., and dried to prepare the organic undercoat layer. In the former method, a 0.005 to 10% by weight solution of the aforesaid organic compound can be applied using various techniques, whereas in the latter method, the concentration of the solution is from 0.01 to 20% by weight, and preferably from 0.05 to 5% by weight; the dipping temperature is from 20° to 90° C., and preferably from 25° to 50° C.; and the time required for dipping is from 0.1 second to 20 minutes, and preferably from 2 seconds to 1 minute. The solution used for this purpose can be adjusted to a range of pH 1 to 12 with a basic substance such as ammonia, triethylamine or potassium hydroxide, or a acidic substance such as hydrochloric acid or phosphoric acid. To improve tone reproducibility of the photosensitive lithographic printing plates, a yellow dye can also be added thereto.

The covered amount of the organic undercoat layer is suitably from 2 to 200 mg/m$^2$, and preferably from 5 to 100 mg/m$^2$. The covered amount of less than 2 mg/m$^2$ fails to give sufficient press life. The covered amount exceeding 200 mg/m$^2$ also brings about the same result.

The mat layer is provided on the surface of the positive photosensitive lithographic printing plate of the present invention to shorten the time required for evacuation and to prevent the lack of sharpness on contact exposure using a vacuum printing frame. To provide the mat layer, for example, there are the methods as described in JP-A-50-125805, JP-A-57-6582 and JP-B-61-28986 and the method of fusing solid powder as described in JP-B-62-62337.

The average diameter of the mat layer used in the invention is preferably 100 μm of less, and more preferably from 2 to 8 μm. A larger average diameter is unfavorable to thin lines and also decreases highlight dots, resulting in deteriorating tone reproducibility. An average diameter of 2 μm or less causes insufficient vacuum contact properties to develop the lack of sharpness. The coated amount of the mat layer is preferably from 5 to 200 mg/m$^2$, and more preferably from 20 to 150 mg/m$^2$. A coated amount exceeding this range causes scratches and a coated amount below this range results in poor vacuum contact properties.

The thus prepared positive photosensitive lithographic printing plates are usually subjected to image exposure and development processing.

Examples of sources of active rays used in the image exposure include mercury lamps, metal halide lamps, xenon lamps, chemical lamps and carbon-arc lamps. As radiations, there are electron radiations, x-rays, ion beams, and far infrared rays. There are also used g-rays, i-rays, deep ultraviolet rays, and high-density energy beams (laser beams). Examples of the laser beams include helium neon laser, argon laser, krypton laser, helium cadmium laser and KrF excimer laser.

Examples of aqueous alkali developer compositions used for development after exposure include a developer composition comprising benzyl alcohol, an anionic surface active agent, an alkali agent and water described in JP-A-51-77401, a developer composition comprising benzyl alcohol, an anionic surface active agent and an aqueous solution containing a water-soluble sulfite described in JP-A-53-44202, and a developer composition containing an organic solvent of which solubility in water is 10% by weight or less at normal temperatures, an alkali agent and water described in JP-A-55-155355.

All these developer compositions contain the organic solvents. However, organic solvents have many disadvantages in that they generally have toxicity and odor, and fire hazard, and further in that their waste liquor is subjected to the BOD regulation and cost also rises. Accordingly, the use of developer compositions substantially not containing organic solvents is desired.

In the present invention, "substantially not containing organic solvents" means that the amount of the organic solvents contained in the compositions is 3% by weight or less, preferably 1% by weight or less, further preferably 0.5% by weight or less, and most preferably zero, in view of the aforesaid safety.

The developer compositions substantially not containing organic solvents include the compositions hitherto used for development of customary positive photosensitive lithographic printing plates. However, these developer compositions are very strong in alkalinity, which may inflict bodily injuries such as skin eruption or inflammation, when they adhere to human bodies.

Accordingly, the developer compositions used in the present invention are desired substantially not to contain organic solvents and to be pH 12.5 or less.

Alkali agents used for such developers are preferably weak bases or salts of weak acids and strong bases. Examples thereof include organic amines such as monoethanolamine, diethanolamine, or triethanolamine, sodium carbonate, potassium carbonate, sodium hydrogencarbonate, potassium hydrogencarbonate, sodium or potassium salts of organic carboxylic acids, sodium or potassium salts of phosphoric acid (primary, secondary and tertiary), and sodium or potassium salts of boric acid (primary, secondary and tertiary). Among these alkali agents, the organic amines and carbonates are preferred. In order to prevent deterioration of the developers, two or more kinds of alkali agents are preferably used together.

The content of these alkali agents in the developer compositions is from 1 to 15% by weight, preferably from 1 to 10% by weight, and more preferably from 3 to 7% by weight.

In the development using an automatic processor, it is known that a large quantity of presensitized plates can be processed without exchanging the developer in a developing tank over a long period of time by adding thereto an aqueous solution (replenisher) of higher alkalinity than the original developer. Also, in the present invention, this replenishing technique is preferably adopted.

In order to accelerate or inhibit development, to disperse sediment in the developer, and to increase ink receptivity at the image portions of printing plates, various surface active agents and organic solvents can be added, as needed, to the developers and replenishers of the present invention. Preferred examples of the surface active agents include anionic, cationic, nonionic and amphoteric surface active agents.

Particularly preferred examples of the surface active agents include anionic and amphoteric surface active agents as described in JP-A-50-51324 and nonionic surface active agents as described in JP-A-59-75255 and JP-A-60-111246. The content of these surface active agents in the developer compositions is 10% by weight or less, and preferably 6% by weight or less.

Further, to the developers and replenishers used in the present invention, there can be also added, as needed, hydroquinone, resorcin, reducing agents such as sodium and potassium salts of inorganic acids, e.g., sulfites and hydrogensulfites, and in addition, organic carboxylic acids, defoaming agents and hard water softeners.

The content of the sulfites used in the developer compositions is 5% by weight or less, preferably from 0.05 to 3% by weight, and more preferably from 0.1 to 0.5% by weight.

The pH of the developer compositions suitably used in the present invention preferably ranges 12.5 or less, more preferably from 8 to 11.5, and particularly preferably from 9 to 11.5. Developers of more than pH 12.5 are unfavorable in view of handling properties and the prevention of environmental pollution. Developers of less than pH 8 are unfavorable in view of the development speed.

When the photosensitive composition of the present invention is developed with the aforesaid developer, the compounds of the present invention may merely swell in the developer, although it is preferred that they can be dissolved or dispersed therein. In this case, the photosensitive composition in exposed portions is preferably rubbed off mechanically by a brush or the like after dipped in the developer.

The printing plate developed using the aforesaid developer and replenisher is post-processed with washing water, a rinse solution containing a surface active agent, etc., and a desensitizing liquid containing gum arabic and a starch derivative. These processings can be used in various combinations thereof for the post-processing of the printing plate of the present invention.

In recent years, in the platemaking and printing industries, the automatic processors for printing plates are widely used to rationalize and standardize the platemaking operation. The automatic processor generally comprises a development portion and a post-processing portion, either of which includes a conveying system of printing plates, a tank of a processing liquid and a spraying system, wherein light-exposed printing plates are developed by spraying each processing liquid pumped through a spray nozzle while horizontally conveying the printing plates. Lately, there is also known a method in which printing plates are conveyed while dipping in a tank filled with a processing liquid through guide rolls and the like. In such automatic processing, the printing plates can be treated while adding each replenisher to the corresponding processing liquid according to processed quantity and operating time.

There can also be adopted a so-called "throwaway processing system", where printing plates are processed with a substantially virgin liquid.

When the lithographic printing plate of the present invention obtained by image exposure, development, water-washing and/or rinsing and/or gumming has unnecessary image portions (for example, film edge marks of an original film), the unnecessary image portions are deleted. Such deletion is preferably conducted through a method that the unnecessary portions are coated with a deletion fluid, allowed to stand for a specified period of time, and thereafter washed with water as described in JP-B-2-13293. There can be also used a method that the unnecessary image portions are irradiated with active rays conducted through optical fibers, and developed as described in JP-A-59-174842.

The thus obtained lithographic printing plate is coated with desensitizing gum, if desired, and thereafter is supplied to the printing stage. However, when much higher impression capacity is desired, the lithographic printing plate is subjected to burning treatment.

When the lithographic printing plate is subjected to burning treatment, it is preferably treated with burning conditioners as described in JP-B-61-2518, JP-B-55-28062, JP-A-62-31859 and JP-A-61-159655, prior to burning.

As the methods, there are adopted a method that the burning conditioner is coated on the surface of the lithographic printing plate with a sponge or absorbent cotton containing the burning conditioner soaked therein, and a method that the lithographic printing plate is dipped in the burning conditioner in a tray, and a method that it is coated using an automatic coater. It brings about a good result to unify the coated amount using squeegees or squeegee rollers.

In general, the coated amount of the burning conditioner is suitably from 0.03 to 0.8 $g/m^2$ (dry weight).

After dried, as needed, the lithographic printing plate coated with the burning conditioner is heated at increased temperatures using a burning processor (for example, Burning Processor: BP-1300 sold by Fuji Photo Film Co., Ltd.), and the like. Although the heating temperature and heating time partly depend upon the kind of image-forming components, the heating temperature preferably ranges from 180° to 300° C., and the heating time preferably ranges from 1 to 20 minute.

The burning-treated lithographic printing plate can be subjected to customary treatment such as water washing or gumming, as needed. Then, the use of the burning conditioner containing a water-soluble polymer enables the omission of the so-called desensitizing treatment such as gumming.

The thus prepared lithographic printing plate is set on a offset printing machine to obtain a number of prints.

[Reference Example]

A polymerization example of two-equivalent coupler monomer (11) illustrated above will be described below.

In a three necked flask equipped with a stirrer, 30.0 g of coupler monomer (11) and 60.0 g of dimethylformamide were placed, followed by stirring in a stream of nitrogen while maintaining the internal temperature at 65° C.

To the mixture, 180 mg of 2,2'-azobis(2,4-dimethylvalero-nitrile) was added, and stirred for 2 hours at the same temperature. Further, 450 mg of 2,2'-azobis(2,4-dimethyl-valeronitrile) was added thereto, and successively stirred for 4 hours at 65° C., followed by allowing to cool. The reaction mixture was poured into 1.5 liter of water to precipitate a solid, which was filtered off and dried.

Yield: 29.5 g

Viscosity: 8.00 cps (0.5 g of the solid was dissolved in DMF; E type viscometer manufactured by Tokyo Keiki Co., Ltd.)

In measurement of $^1$H-NMR (in $CDCl_3$) of the solid obtained, the peak of 5.72 ppm (TMS standard) assigned to the vinyl proton of monomer (11) disappeared completely. As the result, it was ascertained for the solid to be a polymer.

The present invention will be illustrated with reference to examples in more detail below. In the following examples, % means % by weight, unless otherwise referred to.

EXAMPLE 1

Supports were prepared according to the method disclosed in JP-A-56-28893. That is, 0.24 mm-thick aluminum plates were subjected to graining on the surface using a nylon brush and an aqueous suspension of 400-mesh pumistone, and then sufficiently washed with water. The aluminum plates were subsequently dipped in 10% sodium hydroxide at 70° C. for 60 seconds to etch, washed with running water, neutralized with 20% $HNO_3$, and washed with water. These were subjected to electrolytic surface-roughening treatment at a quantity of electricity on an anode of 160 coulomb/$dm^2$ in a 1% aqueous solution of nitric acid using alternating wave shape current under a ratio of a quantity of electricity on a cathode to a quantity of electricity on an anode of 0.8 at a voltage on an anode of 12.7 V. The surface roughness was 0.6 μ (Ra indication). The aluminum plates were subsequently dipped in 30% sulfuric acid at 55° C. for 2 minutes to desmut, and then were subjected to anodizing treatment in 20% sulfuric acid at a current density of 2 A/$dm^2$ for 2 minutes so that the thickness could become 2.7 g/$m^2$. Thereafter, the aluminum plates were dipped in a 2.5% aqueous solution of sodium silicate of 70° C. for 1 minute, washed with water, and dried. The thus prepared substrates were coated with the following photosensitive solutions [A]-1 to [A]-12, respectively, using a whirler, and dried at 100° C. for 2 minutes. The dry weight was 2 g/$m^2$.

Two-equivalent coupler residue-containing compounds of the present invention used in photosensitive solutions [A]-1 to [A]-12 are shown in Table A.

| Photosensitive Solution [A] | |
|---|---|
| Esterification product of naphthoquinone-(1,2)-diazide-(2)-5-sulfonyl chloride with a pyrogallol-acetone resin (described in Example 1 of U.S. Pat. No. 3,635,709) | 0.90 g |
| Two-equivalent coupler residue-containing compound of the present invention (Table A) | 2.10 g |
| 2-Trichloromethyl-5-(4-hydroxystyryl)-1,3,4-oxadiazole | 0.04 g |
| Phthalic anhydride | 0.20 g |
| Oil soluble dye (CI42595) | 0.03 g |
| Ethylene dichloride | 15 g |
| Methyl cellosolve | 8 g |

For comparative examples, photosensitive solutions [B]-1 to [B]-4 containing compounds for comparison in place of the two-equivalent coupler residue-containing compounds of the present invention are similarly coated and dried. The dry weight was 2 g/$m^2$. The compounds for comparison used in photosensitive solutions [B]-1 to [B]-4 are shown in Table A. Photosensitive lithographic printing plates [A]-1 to [A]-12 and [B]-1 to [B]-4 obtained from photosensitive solutions [A]-1 to [A]-12 and [B]-1 to [B]-4, respectively, were subjected to image exposure at a distance of 1 m for 1 minute using a PS Light manufactured by Fuji Photo Film Co., Ltd., and dipped in the following developer at room temperature for 1 minute. Then, surfaces thereof were lightly rubbed with developing pad to remove unexposed portions, thereby obtaining lithographic printing plates [A]-1 to [A]-12 and [B]-1 to [B]-4. The pH of the developer was 1.3 (25.0° C.).

| Developer | |
|---|---|
| Sodium sulfite | 5 g |
| Benzyl alcohol | 30 g |
| Sodium carbonate | 5 g |
| Sodium isopropylnaphthalenesulfonate | 12 g |
| Water | 1,000 g |

The thus prepared lithographic printing plates were set on an offset printing machine to test press life. Deteriorated impression capacity would wear image portions even with printing of a smaller number of sheets to hinder the adhesion of ink thereto, thereby failing to obtain normal printed matter.

To check the range of the proper conditions for development (development permissibility), changes in tone reproducibility between the photosensitive printing plates dipped in the aforesaid developer for 5 minutes and the plates dipped therein for 1 minute were examined. The photosensitive printing plates in which changes are scarcely observed are represented by A, the plates in which wide changes are observed are represented by C, and the plates intermediate therebetween are represented by B. To check the adhesion of the photosensitive compositions to the supports and flexibility, image portions were marred with a diamond stylus constantly loaded after exposure, followed by development and printing, to examine the easiness of scratching. The lithographic printing plates difficult to be scratched are represented by A, the plates easy to be scratched are represented by C, and the plates intermediate therebetween are represented by B. These results, which are shown in Table A, clearly show that the photosensitive compositions of the present invention have very excellent performance.

TABLE A

| Photo-sensitive Solution No. | Compound of the Present Invention | Mw | Press Life (sheet) | Development Permissibility | Easiness of Scratching |
|---|---|---|---|---|---|
| A-1 | Polymer described in Reference Example [Polymer of Coupler (11)] | 40,000 | 140,000 | A | A |
| A-2 | Polymer of Coupler Monomer (6) | 30,000 | 130,000 | A | A |
| A-3 | Polymer of Coupler Monomer (22) | 20,000 | 140,000 | A | A |
| A-4 | Polymer of Coupler Monomer (27) | 30,000 | 140,000 | A | A |
| A-5 | Polymer of Coupler Monomer (32) | 20,000 | 140,000 | B | A |
| A-6 | Copolymer of Coupler Monomer (11) and Butyl Acrylate (Molar Ratio 9/1) | 45,000 | 130,000 | A | A |
| A-7 | Copolymer of Coupler Monomer (11) and Butyl Acrylate (Molar Ratio 4/6) | 50,000 | 140,000 | A | A |
| A-8 | Copolymer of Coupler Monomer (11) and Butyl Acrylate (Molar Ratio 2/8) | 50,000 | 140,000 | A | A |
| A-9 | Copolymer of Coupler Monomer (11) and Ethyl Acrylate (Molar Ratio 2/8) | 30,000 | 130,000 | A | A |
| A-10 | Copolymer of Coupler Monomer (11), Butyl Acrylate and Acrylonitrile (Molar Ratio 2/3/5) | 20,000 | 150,000 | A | A |
| A-11 | Copolymer of Coupler Monomer (11) and Hexyl Acrylate (Molar Ratio 2/8) | 40,000 | 140,000 | A | A |
| A-12 | Coupler Monomer (11) | — | 130,000 | A | B |
| B-1 | Copolymer of Methyl Methacrylate and Methacrylic Acid (Molar Ratio 8/2) | 30,000 | 120,000 | C | A |
| B-2 | Polyhydroxystyrene | 10,000 | 90,000 | A | B |
| B-3 | m-Cresol Novolak Resin | 4,000 | 100,000 | A | C |
| B-4 | Polymer of Four-Equivalent Coupler Residue-Containing Compound* | 20,000 | 120,000 | C | A |

*Four-equivalent coupler residue-containing compound
$CH_2=CCH_3-CONH$

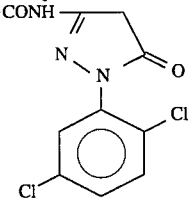

EXAMPLE 2

Supports prepared in a manner similar to that of Example 1 were coated with the following photosensitive solutions, respectively, using a whirler, and dried at 100° C. for 2 minutes.

| | |
|---|---|
| Esterification product of naphtho-quinone-(1,2)-diazide-(2)-5-sulfonyl chloride with a cresol novolak resin | 0.75 g |
| Tetrahydrophthalic anhydride | 0.15 g |
| Polymer described in Table B | 2.10 g |
| 2-(p-Butoxyphenyl)-4,6-bis(trichloro-methyl)-s-triazine | 0.02 g |
| Naphthoquinone-1,2-diazide-4-sulfonyl chloride | 0.03 g |

-continued

| | |
|---|---|
| Crystal Violet | 0.01 g |
| Oil Blue #603 (manufactured by Orient Kagaku Kogyo Co., Ltd.) | 0.015 g |
| Ethylene dichloride | 18 g |
| 2-Methoxyethyl acetate | 12 g |

The coated amount after drying was 2.0 g/m². These photosensitive lithographic printing plates are evaluated according to methods similar to those of Example 1. The results, which are shown in Table B, show that the photosensitive compositions of the present invention have excellent performance.

TABLE B

| Photo-sensitive Solution No. | Compounds of the Present Invention | Press Life (sheet) | Development Permissibility | Easiness of Scratching |
|---|---|---|---|---|
| A-13 | Polymer described in Reference Example [Polymer of Coupler Monomer (11)] | 140,000 | A | A |
| A-14 | Polymer of Coupler Monomer (6) | 140,000 | A | A |
| A-15 | Copolymer of Coupler Monomer (11) and Butyl Acrylate (Molar Ratio 4/6) | 140,000 | A | A |
| A-16 | Copolymer of Coupler Monomer (11), | 150,000 | A | A |

TABLE B-continued

| Photo-sensitive Solution No. | Compounds of the Present Invention | Press Life (sheet) | Development Permissibility | Easiness of Scratching |
|---|---|---|---|---|
| | Butyl Acrylate and Acrylonitrile (Molar Ratio 2/3/5) | | | |

EXAMPLE 3

Supports prepared in a manner similar to that of Example 1 were coated with the following photosensitive solutions, respectively, using a whirler, and dried at 100° C. for 2 minutes.

| | |
|---|---|
| Esterification product of 2,3,4-trihydroxybenzophenone and naphthoquinone-(1,2)-diazide-5-sulfonyl chloride (Esterification ratio; 90 mol %) | 0.45 g |
| Tetrahydrophthalic anhydride | 0.15 g |
| Polymer described in Table C | 2.10 g |
| 2-(p-Butoxyphenyl)-4,6-bis(trichloromethyl)-s-triazine | 0.02 g |
| Naphthoquinone-1,2-diazide-4-sulfonyl chloride | 0.03 g |
| Crystal Violet | 0.01 g |
| Oil Blue #603 (Manufactured by Orient Kagaku Kogyo Co., Ltd.) | 0.015 g |
| Ethylene Dichloride | 18 g |
| 2-Methoxyethyl Acetate | 12 g |

The coated amount after drying was 1.8 g/m². These photosensitive lithographic printing plates were evaluated in manners similar to those of Example 1. The results, which are shown in Table C, show that the photosensitive compositions of the present invention have excellent performance.

TABLE C

| Photo-sensitive Solution No. | Compounds of the Present Invention | Press Life (sheet) | Development Permissibility | Easiness of Scratching |
|---|---|---|---|---|
| A-17 | Polymer described in Reference Example [Polymer of Coupler monomer (11)] | 130,000 | A | A |
| A-18 | Polymer of Coupler Monomer (6) | 130,000 | A | A |
| A-19 | Copolymer of Coupler Monomer (11) and Butyl Acrylate (Molar Ratio 4/6) | 130,000 | A | A |
| A-20 | Copolymer of Coupler Monomer (11), Butyl Acrylate and Acrylonitrile (Molar Ratio 2/3/5 | 140,000 | A | A |

EXAMPLE 4

Aluminum plates having a thickness of 0.30 mm (material 1050) were washed with trichloroethylene to degrease, and the surfaces were then subjected to graining using a nylon brush and an aqueous suspension of 400-mesh pumice, followed by sufficient washing with water. The plates were dipped in a 25% aqueous solution of sodium hydroxide at 45° C. for 9 seconds for etching, washed with water, further dipped in 20% nitric acid for 20 seconds, and washed with water. The etching amount of the grained surfaces was about 3 g/m². Subsequently, these plates were treated in 7% sulfuric acid as an electrolyte at a current density of 15 A/dm² to provide direct current anode oxide layers of 3 g/m², washed with water, and dried. The aluminum plates were coated with the following undercoat solution, and dried at 80° C. for 30 seconds. The covered amount after drying was 10 mg/m².

| (Undercoat Solution) | |
|---|---|
| β-Alanine | 0.1 g |
| Phenylphosphonic acid | 0.05 g |
| Methanol | 40 g |
| Pure water | 60 g |

The aluminum plates were coated with the photosensitive solutions described in Example 1, respectively, and dried at 100° C. for 2 minutes to obtain positive photosensitive lithographic printing plates. The coated weight after drying was 2.0 g/m².

These photosensitive lithographic printing plates were exposed to light and developed in a manner similar to that of Example 1, and then subjected to the following processing.

| (Stock Solution of Processing Liquid) | |
|---|---|
| 50% Aqueous solution of potassium silicate (Molar ratio of SiO₂/K₂O; 2) | 37.7 wt % |
| 48% Aqueous solution of potassium hydroxide | 4.8 wt % |
| Polyoxyethylene (the number of added molecules n = 12) Sorbitol | 0.2 wt % |
| Tetrasodium salt of EDTA | 0.1 wt % |
| Ion-exchanged water | 57.2 wt % |

A development bath of an automatic processing machine, STABLON 900NP manufactured by Fuji Photo Film Co., Ltd., was charged with a processing liquid (pH 12.4) prepared by diluting the above stock solution 9 times (1:8) with tap water, a first rinse bath with tap water, and a second rinse bath with the liquid prepared by diluting Finisher FP-2W (manufactured by Fuji Photo Film Co., Ltd.) twice (1:1) with tap water. The aforesaid photosensitive lithographic printing plates were processed under the conditions of a liquid temperature of 30° C. and a processing time of 20 seconds.

The lithographic printing plates thus obtained are evaluated in manners similar to those of Example 1. The results, which are shown in Table D, show that the photosensitive compositions of the present invention have excellent performance.

TABLE D

| Photo-sensitive Solution No. | Compounds of the Present Invention | Press Life (sheet) | Development Permissibility | Easiness of Scratching |
|---|---|---|---|---|
| A-1 | Polymer described in Reference Example [Polymer of Coupler (11)] | 140,000 | A | A |
| A-2 | Polymer of Coupler Monomer (6) | 130,000 | A | A |
| A-3 | Polymer of Coupler Monomer (22) | 140,000 | A | A |
| A-4 | Polymer of Coupler Monomer (27) | 130,000 | A | A |
| A-5 | Polymer of Coupler Monomer (32) | 140,000 | B | A |
| A-6 | Copolymer of Coupler Monomer (11) and Butyl Acrylate (Molar Ratio 9/1) | 130,000 | A | A |
| A-7 | Copolymer of Coupler Monomer (11) and Butyl Acrylate (Molar Ratio 4/6) | 140,000 | A | A |
| A-8 | Copolymer of Coupler Monomer (11) and Butyl Acrylate (Molar Ratio 2/8) | 130,000 | A | A |
| A-9 | Copolymer of Coupler Monomer (11) and Ethyl Acrylate (Molar Ratio 2/8) | 130,000 | A | A |
| A-10 | Copolymer of Coupler Monomer (11), Butyl Acrylate and Acrylonitrile (Molar Ratio 2/3/5) | 150,000 | A | A |
| A-11 | Copolymer of Coupler Monomer (11) and Hexyl Acrylate (Molar Ratio 2/8) | 130,000 | A | A |
| A-12 | Coupler Monomer (11) | 130,000 | A | B |
| B-1 | Copolymer of Methyl Methacrylate and Methacrylic Acid (Molar Ratio 8/2) | 120,000 | C | A |
| B-2 | Polyhydroxystyrene | 90,000 | A | B |
| B-3 | m-Cresol Novolak Resin | 100,000 | A | C |
| B-4 | Polymer of Four-Equivalent Coupler Residue-Containing Compound* | 120,000 | C | A |

*Four-equivalent coupler residue-containing compound
$CH_2=CCH_3-CONH-$

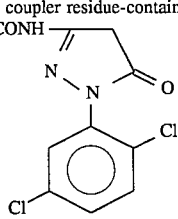

The present invention can provide the photosensitive lithographic printing plates which have a wide range of proper conditions for development and high impression capacity, and can form images with weakly alkaline developers of pH 12.5 or less by combinations of the two-equivalent coupler residue-containing compounds with the photosensitive compounds and/or the photosensitive mixtures acting as a positive type.

Further, when the two-equivalent coupler residue-containing compounds are polymers, there can be provided the photosensitive lithographic printing plates which contain flexible films of good adhesion to the supports, and have more excellent wear resistance, and in addition, a wide range of more proper conditions for development (wide development permissibility).

While the invention has been described in detail and with reference to specific embodiments thereof, it will be apparent to one skilled in the art that various changes and modifications can be made therein without departing from the spirit and scope thereof.

What is claimed is:

1. A photosensitive lithographic printing plate, comprising a support and a photosensitive layer provided thereon, wherein said photosensitive layer is formed from a photosensitive composition containing (a) a two-equivalent coupler residue-containing polymer and (b) a positive-acting photosensitive compound or photosensitive mixture, wherein said printing plate is capable of forming images by processing with a weakly alkaline developer of pH 12.5 or less.

2. A photosensitive lithographic printing plate according to claim 1, wherein the support is an aluminum plate.

3. A photosensitive lithographic printing plate according to claim 2, wherein the support is an aluminum plate subjected to silicate treatment.

4. A photosensitive lithographic printing plate according to claim 1, wherein said two-equivalent coupler residue-containing polymer is a polymer which contains a two-equivalent coupler residue in its molecule, said residue having a dissociation constant (pKa) of an active methine moiety ranging from 3 to 11, and is insoluble in water and soluble in alkaline developers.

* * * * *